(12) United States Patent
Jeung et al.

(10) Patent No.: US 9,627,450 B2
(45) Date of Patent: Apr. 18, 2017

(54) ORGANIC LIGHT EMITTING DISPLAY DEVICE

(71) Applicant: SAMSUNG DISPLAY CO., LTD., Yongin, Gyeonggi-do (KR)

(72) Inventors: Jun-Heyung Jeung, Yongin (KR); Tae-Jin Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/968,387

(22) Filed: Dec. 14, 2015

(65) Prior Publication Data
US 2016/0099295 A1   Apr. 7, 2016

Related U.S. Application Data

(62) Division of application No. 13/970,549, filed on Aug. 19, 2013, now Pat. No. 9,214,499.

(30) Foreign Application Priority Data

Feb. 12, 2013 (KR) .................. 10-2013-0014971

(51) Int. Cl.
*H01L 21/00* (2006.01)
*H01L 27/32* (2006.01)

(52) U.S. Cl.
CPC ...... *H01L 27/3218* (2013.01); *H01L 27/3209* (2013.01)

(58) Field of Classification Search
CPC .................. H01L 27/3218; H01L 27/3209
See application file for complete search history.

(56) References Cited

U.S. PATENT DOCUMENTS

| 7,688,410 B2 | 3/2010 | Kim et al. |
| 2007/0000319 A1 | 1/2007 | Sasaki et al. |
| 2011/0227875 A1 | 9/2011 | Chung |
| 2012/0074435 A1* | 3/2012 | Ha ............... H01L 51/5203 257/88 |
| 2012/0182257 A1 | 7/2012 | Yamamoto et al. |
| 2014/0225078 A1 | 8/2014 | Jeung et al. |
| 2015/0153882 A1 | 6/2015 | Kim et al. |

FOREIGN PATENT DOCUMENTS

| JP | 2008-112112 A | 5/2008 |
| KR | 10-2011-0104794 A | 9/2011 |

* cited by examiner

*Primary Examiner* — Laura Menz
(74) *Attorney, Agent, or Firm* — Lewis Roca Rothgerber Christie LLP

(57) ABSTRACT

An organic light emitting display device includes a plurality of first sub-pixels arranged adjacent to each other along a first direction, each of the first sub-pixels includes a first emission region configured to emit light of a first color and a first transmission region configured to transmit external light, the first emission regions of at least two of the first sub-pixels are adjacent to each other; and a plurality of second sub-pixels arranged adjacent to each other along the first direction and adjacent to corresponding ones of the plurality of first sub-pixels along a second direction crossing the first direction, each of the plurality of second sub-pixels includes a second emission region configured to emit light of a second color and a second transmission region configured to transmit external light, the second emission regions of at least two of the sub-pixels are adjacent to each other.

16 Claims, 14 Drawing Sheets

ORGANIC LIGHT EMITTING DISPLAY DEVICE

CROSS-REFERENCE TO RELATED APPLICATION

This application is a divisional of U.S. patent application Ser. No. 13/970,549, filed Aug. 19, 2013, which claims priority to and the benefit of Korean Patent Application No. 10-2013-0014971, filed Feb. 12, 2013, the entire contents of both of which are incorporated herein by reference.

BACKGROUND

1. Field

The following description relates to an organic light emitting display device.

2. Description of the Related Art

Organic light emitting display devices are being widely applied to personal portable devices, such as MP3 players and mobile phones, and to TVs due to characteristics such as wide viewing angle, high contrast, fast response speed, and low power consumption.

An organic light emitting display device is self-emissive, and thus, an additional light source is not necessary, unlike in a liquid crystal display (LCD) device. Also, a thickness and a weight of the organic light emitting display device may be less than that of an LCD device.

Also, an organic light emitting display device may be formed as a transparent display device by including transparent thin film transistors (TFTs) or organic light emitting diodes therein.

SUMMARY

Aspects of embodiments of the present invention are directed toward a transparent organic light emitting display device having improved transmittance and capable of displaying an image that appears continuous.

According to an embodiment of the present invention, there is provided an organic light emitting display device including: a plurality of first sub-pixels arranged adjacent to each other along a first direction, each of the plurality of first sub-pixels includes a first emission region emitting configured to emit light of a first color and a first transmission region configured to transmit external light (e.g., without emitting light), wherein the first emission regions of at least two of the plurality of first sub-pixels are adjacent to each other; and a plurality of second sub-pixels arranged adjacent to each other along the first direction and adjacent to corresponding ones of the plurality of first sub-pixels along a second direction crossing the first direction, each of the plurality of second sub-pixels includes a second emission region configured to emit light of a second color different from the first color and a second transmission region configured to transmit external light, wherein the second emission regions of at least two of the plurality of second sub-pixels are adjacent to each other.

The first transmission region of one of the plurality of first sub-pixels and the second transmission region of a corresponding one of the plurality of second sub-pixels may be adjacent to and separated from each other along the second direction.

At least one of the first and second transmission regions may be an island.

The first transmission region of one of the plurality of first sub-pixels and the second transmission region of a corresponding one of the plurality of second sub-pixels may be adjacent and connected to each other along the second direction.

The first emission region of one first sub-pixel may be divided by the corresponding first transmission region.

The second emission region of one second sub-pixel may be divided by the corresponding second transmission region.

The first transmission region and the second transmission region may have areas that are different from each other.

Either the first or second sub-pixel having a light emission efficiency greater than that of the other sub-pixel may have a transmission region that is larger than the transmission region of the other sub-pixel.

The first emission region and the second emission region may have shapes that are different from each other.

The first transmission region and the second transmission region may have shapes that are different from each other.

According to another embodiment of the present invention, there is provided an organic light emitting display device including: a plurality of first pixel circuit units; a plurality of 1-1 electrodes adjacent to and separated from each other along a first direction, each of the plurality of 1-1 electrodes are electrically coupled to a corresponding one of the plurality of first pixel circuit units; a first emission layer on the plurality of 1-1 electrodes, the first emission layer configured to emit light of a first color; a plurality of second pixel circuit units; a plurality of 2-1 electrodes adjacent to and separated from each other along the first direction and adjacent to corresponding ones of the plurality of 1-1 electrodes along a second direction crossing the first direction, each of the plurality of 2-1 electrodes are electrically coupled to corresponding ones of the plurality of second pixel circuit units; a second emission layer on the plurality of 2-1 electrodes, the second emission layer configured to emit light of a second color that is different from the first color; and a second electrode on the first and second emission layers, the second electrode includes a plurality of first transmission units, each at a portion of a corresponding one of the plurality of 1-1 electrodes and configured to transmit external light (e.g., without emitting light), and a plurality of second transmission units, each at a portion of a corresponding one of the plurality of 2-1 electrodes and configured to transmit external light (e.g., without emitting light).

Ones of the plurality of first transmission unit and corresponding ones of the plurality of second transmission units may be adjacent to and separated from each other along the second.

At least one of the first and second transmission units may be an island.

One of the plurality of first transmission units and a corresponding one of the plurality of second transmission units may be adjacent and connected to each other along the second direction.

Ones of the plurality of first transmission units may be at an edge portion nearest an adjacent one of the plurality of second transmission units of each of the plurality of 1-1 electrodes.

Ones of the plurality of second transmission units may be at an edge portion nearest an adjacent one of the plurality of first transmission units of each of the plurality of 2-1 electrodes.

The first transmission units and the second transmission units may have areas that are different from each other.

The first or second emission layer having a light emission efficiency greater than that of the other emission layer may have a corresponding transmission unit having an area that is larger than that of the transmission unit corresponding to the other emission layer.

The first transmission units and the second transmission units may have shapes that are different from each other.

BRIEF DESCRIPTION OF THE DRAWINGS

The above and other features and aspects of embodiments of the present invention will become more apparent by describing, in detail, embodiments thereof with reference to the attached drawings in which.

DETAILED DESCRIPTION

Hereinafter, embodiments of the present invention will be described in detail with reference to accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
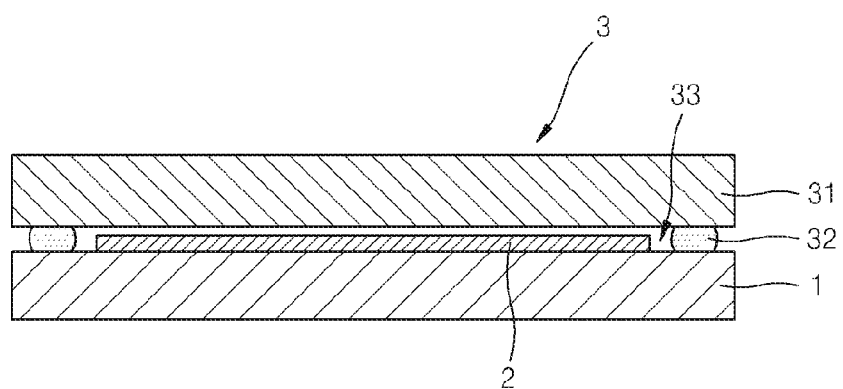
FIG. 1 is a cross-sectional view of an organic light emitting display device according to an embodiment of the present invention.
Figure 2:
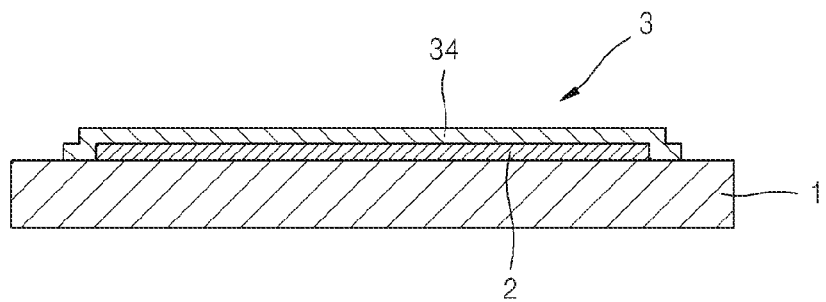
FIG. 2 is a cross-sectional view of an organic light emitting display device according to another embodiment of the present invention.

FIGS. 1 and 2 are cross-sectional views of organic light emitting display devices according to embodiments of the present invention.

Referring to FIG. 1, an organic light emitting display device according to an embodiment of the present invention includes an organic emission unit 2 formed on a surface of a substrate 1 and a sealing unit 3 for sealing the organic emission unit 2.

According to the embodiment, the sealing unit 3 may include a sealing substrate 31. The sealing substrate 31 may be a transparent glass substrate or a transparent plastic substrate so as to transmit images (e.g., transmit light) from the organic emission unit 2 and to prevent external air and/or moisture from infiltrating into the organic emission unit 2.

Edges of the substrate 1 and the sealing substrate 31 (e.g., an area including the periphery of the substrate 1 and the sealing substrate 31) are coupled to each other by a sealing material 32 so that a space 33 between the substrate 1 and the sealing substrate 31 may be sealed. A moisture absorbent and/or a filling material may be located in the space 33.

As shown in FIG. 2, instead of using the sealing substrate 31, a thin sealing film 34 may be formed on or over the organic emission unit 2 to protect and seal the organic emission unit 2 against external air and/or moisture. The sealing film 34 may have a structure, for example, in which a layer formed of an inorganic material, such as silicon oxide or silicon nitride, and a layer formed of an organic material, such as epoxy or polyimide, are alternately formed (e.g., stacked). However, the present invention is not limited thereto, and a sealing structure such as a transparent thin film may be used as the sealing film 34.

The organic light emitting display devices according to the embodiments shown in FIGS. 1 and 2 may be bottom-emission display devices that display images toward the substrate 1 (e.g., display images from the organic emission unit 2 toward the substrate 1), top-emission display devices that display images toward the sealing substrate 31 or the sealing film 34 (e.g., display images from the organic emission unit 2 toward the sealing substrate 31 or the sealing film 34), or dual-emission display devices that display images toward both the substrate 1 and the sealing substrate 31 or both the substrate 1 and the sealing film 34 (e.g., display images from the organic emission unit 2 toward the substrate 1 and either the sealing substrate 31 or the sealing film 34).

Such organic light emitting display devices include a light emission region and a light transmission region so as to form a transparent and/or see-through display device.

However, sub-pixels arranged along lines and emitting light of the same color may appear disconnected (e.g., separated) due to the transmission regions therebetween, thereby reducing a resolution of the display device.

According to embodiments of the present invention, the disconnected appearance of the display device occurring between emission regions of sub-pixels arranged in a line and other sub-pixels arranged in a next line (e.g., an adjacent line) may be addressed by making the emission regions of the sub-pixels of the line and the sub-pixels of the next line (e.g., adjacent line) appear as if they are connected to each other.

Figure 3:
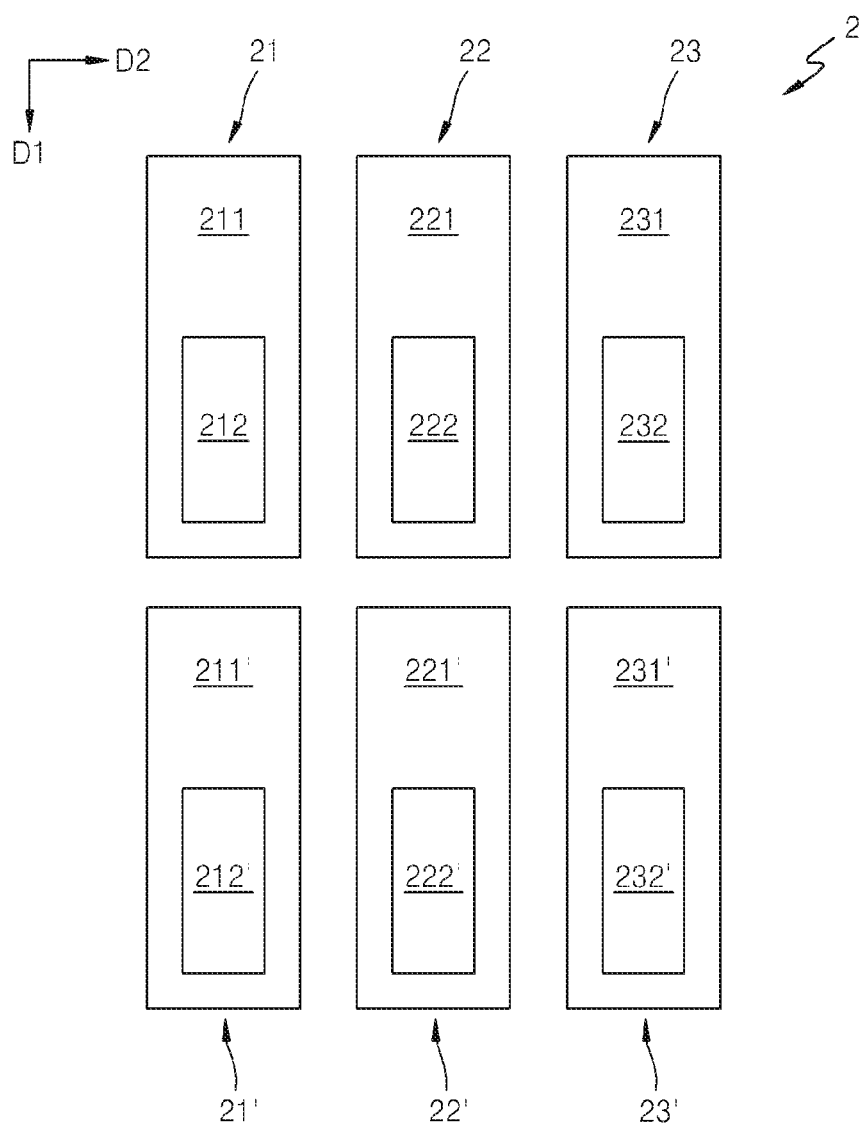
FIG. 3 is a plan view of a part of the organic emission unit shown in FIG. 1 and FIG. 2 in detail.

FIG. 3 is a plan view of a part of the organic emission unit 2 shown in FIGS. 1 and 2 in more detail.

Referring to FIG. 3, first sub-pixels 21 and 21' emit light of a first color and are disposed (e.g., located or arranged) along a first direction D1 to form a column line. In addition, second sub-pixels 22 and 22' emit light of a second color and are disposed adjacent to the first sub-pixels 21 and 21', respectively, along a second direction D2 which crosses (e.g., is substantially perpendicular to) the first direction D1. The second sub-pixels 22 and 22' are arranged along the first direction D1 to form another column line (e.g., an adjacent column line). Third sub-pixels 23 and 23' emit light of a third color and are disposed adjacent to the second sub-pixels 22 and 22', respectively, along the second direction D2. The third sub-pixels 23 and 23' are arranged along the first direction D1 to form yet another column line. The first color may be red, the second color may be green, and the third color may be blue.

The first sub-pixels 21 and 21' respectively include first emission regions 211 and 211' and first transmission regions 212 and 212', wherein the first color light may be emitted by the first emission regions 211 and 211' and external light may be transmitted (e.g., without emitting light) through the first transmission regions 212 and 212'.

The second sub-pixels 22 and 22' respectively include second emission regions 221 and 221' and second transmission regions 222 and 222', wherein the second color light is different from the first color light and may be emitted by the second emission regions 221 and 221' and external light may be transmitted (e.g., without emitting light) through the second transmission regions 222 and 222'.

The third sub-pixels 23 and 23' respectively include third emission regions 231 and 231' and third transmission regions 232 and 232', wherein the third color light is different from the first and second color lights and may be emitted by the third emission regions 231 and 231' and external light may be transmitted (e.g., without emitting light) through the third transmission regions 232 and 232'.

The first emission region 211 of one first sub-pixel 21 and the first emission region 211' of another first sub-pixel 21', the another first sub-pixel 21' being adjacent to the first sub-pixel 21 along the first direction D1, are adjacent to each other.

The first transmission regions 212 and 212' are formed as islands in the first emission regions 211 and 211', respectively. That is, the first transmission regions 212 and 212' are surrounded by (e.g., surrounded along a periphery thereof by) the first emission regions 211 and 211', respectively.

The second emission region 221 of one second sub-pixel 22 and the second emission region 221' of another second sub-pixel 22', the another second sub-pixel 22' being adjacent to the second sub-pixel 22 along the first direction D1, are adjacent to each other.

The second transmission regions 222 and 222' are formed as islands in the second emission regions 221 and 221', respectively. That is, the second transmission regions 222 and 222' are surrounded by (e.g., surrounded along a periphery thereof by) the second emission regions 221 or 221', respectively.

The third emission region 231 of one first sub-pixel 23 and the third emission region 231' of another third sub-pixel 23', the another third sub-pixel 23' being adjacent to the third sub-pixel 23 along the first direction D1, are adjacent to each other.

The third transmission regions 232 and 232' are formed as islands in the third emission regions 231 and 231', respectively. That is, the third transmission regions 232 and 232' are surrounded by (e.g., surrounded along a periphery thereof by) the third emission regions 231 and 231', respectively.

Accordingly, the first sub-pixels 21 and 21' in the column line may appear as if they are connected to each other. Likewise, the second sub-pixels 22 and 22' and the third sub-pixels 23 and 23' may appear as if they are each connected to the corresponding other sub-pixel.

In addition, the transmission regions of the first sub-pixels 21 and 21' and second sub-pixels 22 and 22', and the transmission regions of the second sub-pixels 22 and 22' and the third sub-pixels 23 and 23' are disconnected, and thus, their respective transmitted external light may be represented softly. That is, as shown in FIG. 3, the first transmission regions 212 and 212' and the second transmission regions 222 and 222', and the second transmission regions 222 and 222' and the third transmission regions 232 and 232', which are adjacent to each other along the second direction D2, are separated from each other so that the transmission regions may not appear as lines (e.g., continuous lines) extending along the second direction D2 and the disconnected appearance of the color display (e.g., of the emission regions) may be reduced or prevented.

Figure 4:
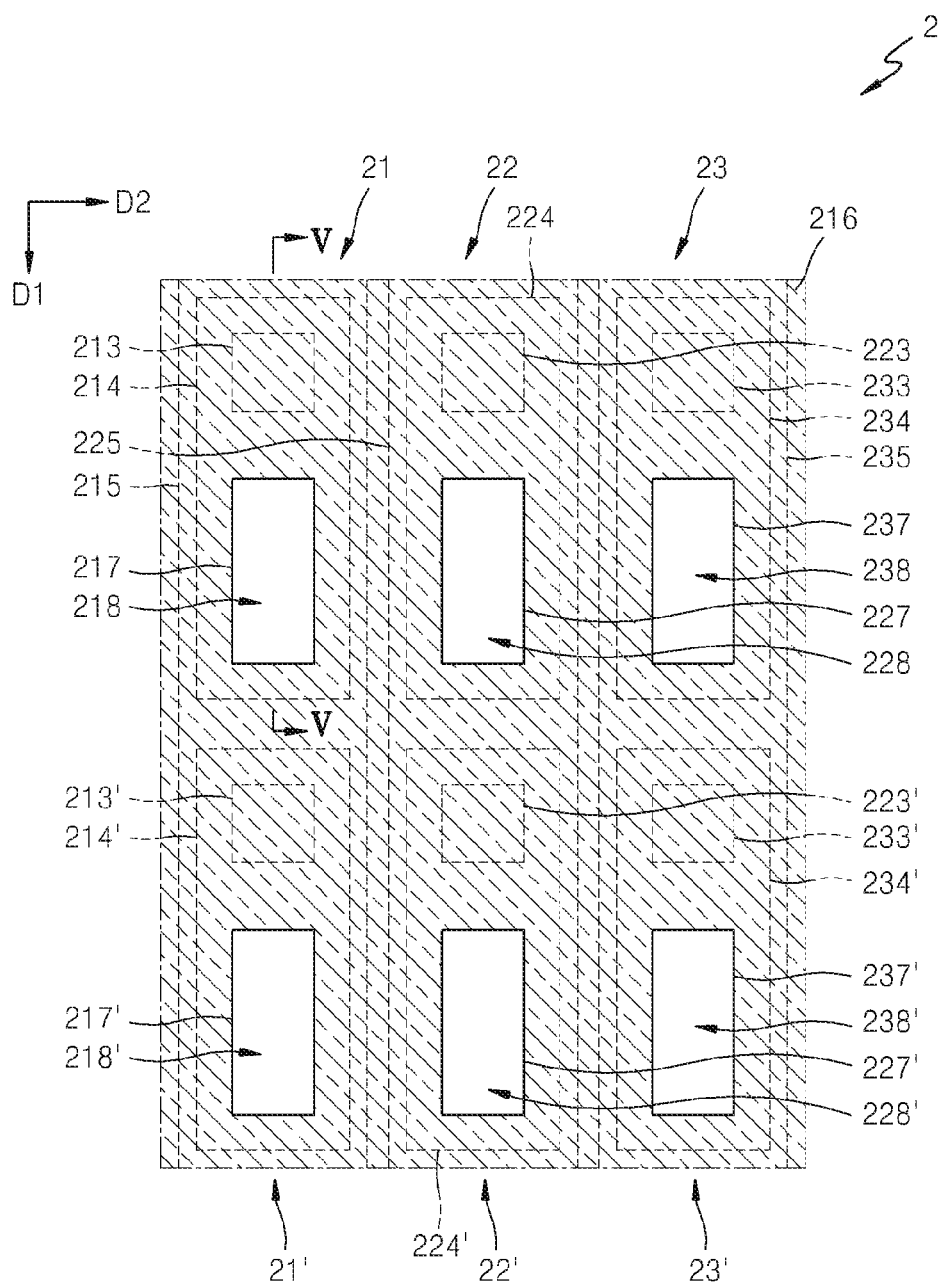
FIG. 4 is a plan view of the organic emission unit of FIG. 3 in more detail.
Figure 5:
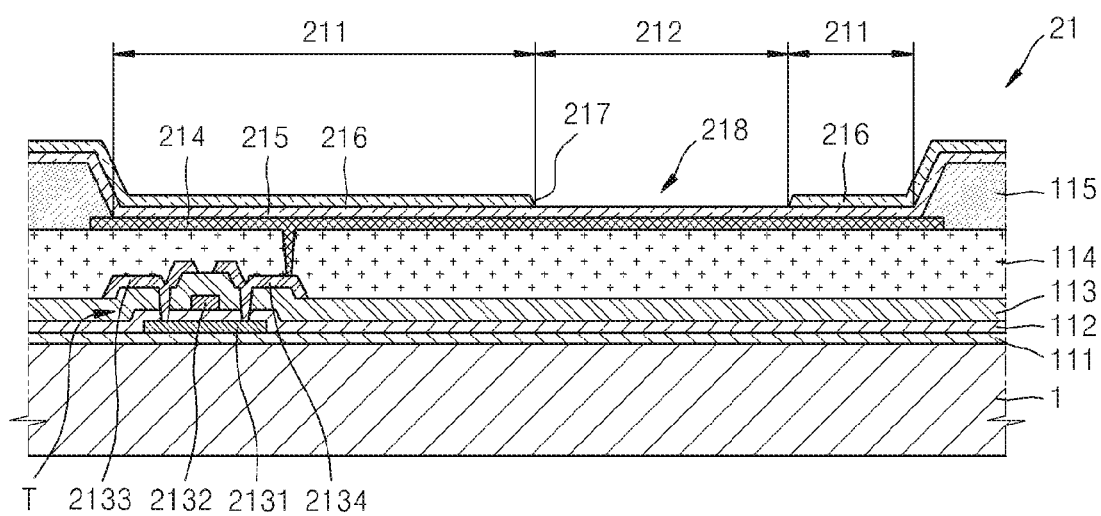
FIG. 5 is a cross-sectional view of the organic emission unit taken along the line V-V of FIG. 4.

FIG. 4 is a diagram showing the organic emission unit 2 of FIG. 3 in more detail, and FIG. 5 is a cross-sectional view of the organic emission unit 2 taken along the line V-V of FIG. 4.

First pixel circuit units 213 and 213' are respectively disposed (e.g., located) in the first sub-pixels 21 and 21'. Each of the first pixel circuit units 213 and 213' may include a thin film transistor T as shown in FIG. 5.

As shown in FIG. 5, a buffer layer 111 is formed on a surface of the substrate 1, and the thin film transistor T is formed on the buffer layer 111.

A semiconductor active layer 2131 is formed on the buffer layer 111.

The buffer layer 111 prevents impurities (e.g., impurity atoms) from infiltrating while the surface of the substrate 1 is planarized and may be formed of various materials capable of performing the above function. For example, the buffer layer 111 may be formed of an inorganic material, such as silicon oxide, silicon nitride, silicon oxynitride, aluminium oxide, aluminium nitride, titanium oxide, or titanium nitride, an organic material, such as polyimide, polyester, or acryl, or a stacked structure thereof. The buffer layer 111 may be omitted if necessary or desired.

The semiconductor active layer 2131 may be formed of polycrystalline silicon; however, the present invention is not limited thereto. That is, the semiconductor active layer 2131 may be formed of oxide semiconductor. For example, the semiconductor active layer 2131 may be a G-I—Z—O layer $[(In_2O_3)_a(Ga_2O_3)_b(ZnO)_c$ layer] (where a, b, and c are real numbers satisfying conditions a≥0, b≥0, and c>0).

A gate insulating layer 112 is formed on the buffer layer 111 so as to cover or substantially cover the semiconductor active layer 2131, and a gate electrode 2132 is formed on the gate insulating layer 112.

An inter-insulating layer 113 is formed on the gate insulating layer 112 so as to cover or substantially cover the gate electrode 2132. A source electrode 2133 and a drain electrode 2134 are formed on the inter-insulating layer 113 and each contact the semiconductor active layer 2131 via corresponding contact holes.

The thin film transistor T is not limited to the above structure, and various structures of the thin film transistor T may be applied.

As shown in FIG. 4, second pixel circuit units 223 and 223' are disposed (e.g., located) in the second sub-pixels 22 and 22', respectively, and third pixel circuit units 233 and 233' are disposed in the third sub-pixels 23 and 23', respectively. Each of the second pixel circuit units 223 and 223' and each of the third pixel circuit units 233 and 233' may include the thin film transistor T shown in FIG. 5.

As shown in FIG. 5, a passivation layer 114 is formed on the inter-insulating layer 113 so as to cover or substantially cover the thin film transistor T, and a 1-1 electrode 214 is formed on the passivation layer 114. The 1-1 electrode 214 may contact the drain electrode 2134 of the thin film transistor T via a hole (e.g., a through hole) formed in the passivation layer 114.

A pixel defining layer 115 is formed on the passivation layer 114 so as to cover edges of the 1-1 electrode 214 (e.g., the pixel defining layer 115 is formed on the passivation layer 114 and along the periphery of the 1-1 electrode 214).

As shown in FIG. 4, 1-1 electrodes 214 and 214' are separated from each other and are respectively located in the first sub-pixels 21 and 21'. The 1-1 electrodes 214 and 214' are electrically coupled to (e.g., electrically connected to) the first pixel circuit units 213 and 213', respectively. In FIG. 4, the 1-1 electrodes 214 and 214' overlap the first pixel circuit units 213 and 213' (e.g., cover the first pixel circuit units 213 and 213'), respectively; however, the present invention is not limited thereto. That is, the 1-1 electrodes 214 and 214' may be located so as not to overlap or cover the first pixel circuit units 213 and 213'.

2-1 electrodes 224 and 224' are separated from each other and are located in the second sub-pixels 22 and 22', respectively. The 2-1 electrodes 224 and 224' are electrically coupled to (e.g., electrically connected to) the second pixel circuit units 223 and 223', respectively. In FIG. 4, the 2-1 electrodes 224 and 224' overlap the second pixel circuit units 223 and 223' (e.g., cover the second pixel circuit units 223 and 223'), respectively; however, the present invention is not limited thereto. That is, the 2-1 electrodes 224 and 224' may be located so as not to overlap or cover the second pixel circuit units 223 and 223'.

3-1 electrodes 234 and 234' are separated from each other and are located in the third sub-pixels 23 and 23', respectively. The 3-1 electrodes 234 and 234' are electrically coupled to (e.g., electrically connected to) the third pixel circuit units 233 and 233', respectively. In FIG. 4, the 3-1 electrodes 234 and 234' overlap the third pixel circuit units 233 and 233' (e.g., cover the third pixel circuit units 233 and 233'), respectively; however, the present invention is not limited thereto. That is, the 3-1 electrodes 234 and 234' may be located so as not to overlap or cover the third pixel circuit units 233 and 233'.

The 1-1 electrodes 214 and 214' may be shaped as rectangles, longer sides of which extend along the first direction D1, as shown in FIG. 4. Likewise, the 2-1 electrodes 224 and 224' and the 3-1 electrodes 234 and 234' may have shapes similar to those of the 1-1 electrodes 214 and 214'.

A first emission layer 215 is formed on (e.g., formed over) the 1-1 electrodes 214 and 214'. Referring to FIG. 4, the first emission layer 215 may be formed as a line (e.g., a continuous line) extending along the first direction D1. However, the present invention is not limited thereto; that is, the first emission layer 215 may be patterned or formed to cover the 1-1 electrodes 214 and 214'.

A second emission layer 225 is formed on (e.g., formed over) the 2-1 electrodes 224 and 224'. Referring to FIG. 4, the second emission layer 225 may be formed as a line (e.g., a continuous line) extending along the first direction D1. However, the present invention is not limited thereto; that is, the second emission layer 225 may be patterned or formed to cover the 2-1 electrodes 224 and 224'.

A third emission layer 235 is formed on (e.g., formed over) the 3-1 electrodes 234 and 234'. Referring to FIG. 4, the third emission layer 235 may be formed as a line (e.g., a continuous line) extending along the first direction D1. However, the present invention is not limited thereto; that is, the third emission layer 235 may be patterned or formed to cover the 3-1 electrodes 234 and 234'.

A second electrode 216 is formed to substantially cover the first emission layer 215, the second emission layer 225, and the third emission layer 235. The second electrode 216 is an electrode to which a common voltage is applied and is formed to substantially cover all the sub-pixels of the organic emission unit 2.

The 1-1 electrodes 214 and 214', the 2-1 electrodes 224 and 224', and the 3-1 electrodes 234 and 234' may be anode electrodes, and the second electrode 216 may be a cathode electrode. However, polarities of the above-described electrodes may be opposite than in the above example.

The first emission layer 215, the second emission layer 225, and the third emission layer 235 may be organic emission layers including an organic emission material emitting red light, an organic emission material emitting green light, and organic emission material emitting blue light, respectively. Although not shown in FIGS. 4 and 5, at least one or more organic layers including a hole injection transport layer and/or an electron injection transport layer may be further disposed (e.g., located) between each of the 1-1 electrodes 214 and 214', the 2-1 electrodes 224 and 224', and the 3-1 electrodes 234 and 234' and the second electrode 216. When the 1-1 electrodes 214 and 214', the 2-1 electrodes 224 and 224', and the 3-1 electrodes 234 and 234' are anode electrodes and the second electrode 216 is a cathode electrode, an organic layer including the hole injection transport layer injection and/or transporting holes may be disposed between each of the first emission layer 215, the second emission layer 225, and the third emission layer 235 and of the 1-1 electrodes 214 and 214', the 2-1 electrodes 224 and 224', and the 3-1 electrodes 234 and 234', respectively. Also, an organic layer including an electron injection transport layer for injecting and/or transporting electrons may be disposed between each of the first emission layer 215, the second emission layer 225, and the third emission layer 235 and the second electrode 216. The hole injection transport layer and the electron injection transport layer are common layers that may cover all the sub-pixels of the organic emission unit 2.

Organic layers including the first emission layer 215, the second emission layer 225, and the third emission layer 235 may be formed in various ways, such as by vacuum deposition, printing, and/or laser thermal transport.

The buffer layer 111, the gate insulating layer 112, the inter-insulating layer 113, the passivation layer 114, and/or the pixel defining layer 115 may be formed as insulating layers having high transmittance.

The 1-1 electrodes 214 and 214', the 2-1 electrodes 224 and 224', and the 3-1 electrodes 234 and 234' may be formed as transparent electrodes, semi-transparent electrodes, or reflective electrodes, and may include, for example, indium tin oxide (ITO), indium zinc oxide (IZO), zinc oxide (ZnO), or indium oxide ($In_2O_3$).

The second electrode 216 may be formed as a transparent electrode, a semi-transparent electrode, or a reflective electrode, and may include silver (Ag), magnesium (Mg), aluminium (Al), platinum (Pt), palladium (Pd), gold (Au), nickel (Ni), neodymium (Nd), iridium (Ir), chromium (Cr), lithium (Li), calcium (Ca), Ytterbium (Yb), or a compound thereof.

As shown in FIGS. 4 and 5, if the 1-1 electrodes 214 and 214', the 2-1 electrodes 224 and 224', and the 3-1 electrodes 234 and 234' are formed in the transparent regions (e.g., transmission regions), they may be formed as transparent electrodes.

As shown in FIGS. 4 and 5, the second electrode 216 includes a transmission window formed as an opening to form a transmission unit.

That is, first transmission windows 217 and 217' of the second electrode 216 transmit external light at locations corresponding to center portions of the 1-1 electrodes 214 and 214' and are formed as openings to form first transmission units 218 and 218'. Second transmission windows 227 and 227' of the second electrode 216 transmit external light at locations corresponding to center portions of the 2-1 electrodes 224 and 224' and are formed as openings to form second transmission units 228 and 228'. Third transmission windows 237 and 237' of the second electrode 216 transmit external light at locations corresponding to center portions of the 3-1 electrodes 234 and 234' and are formed as openings to form second transmission units 238 and 238'. In the present embodiment, the center portion is any portion except for end portions in the first direction D1 of any of the 1-1 electrodes 214 and 214', the 2-1 electrodes 224 and 224', and the 3-1 electrodes 234 and 234', and is not limited to a location in the direct or exact center of the 1-1 electrodes 214 and 214', the 2-1 electrodes 224 and 224', and the 3-1 electrodes 234 and 234' in either the first or second directions D1 and D2. That is, the first transmission units 218 and 218' are not formed on portions corresponding to at least one edge of the 1-1 electrodes 214 and 214'. In addition, the second transmission units 228 and 228' are not formed on portions corresponding to at least one edge of the 2-1 electrodes 224 and 224', and the third transmission units 238 and 238' are not formed on portions corresponding to at least one edge of the 3-1 electrodes 234 and 234'. Accordingly, the appearance of a disconnected display of the emission region due to the transmission units may be reduced.

As described above, because the first transmission units 218 and 218', the second transmission units 228 and 228', and the third transmission units 238 and 238' are formed in the second electrode 216 that includes the metal having a low transmittance and high reflectivity, the external light transmittance of the first transmission regions 212 and 212', the second transmission regions 222 and 222', and the third transmission regions 232 and 232' of the sub-pixels of the organic emission unit 2 shown in FIG. 3 may be high, and the light emission regions of adjacent sub-pixels along the first direction D1 may not appear as if they are disconnected.

In the embodiment shown in FIG. 5, because the first emission layer 215 and the 1-1 electrode 214 are located in the first transmission region 212, the 1-1 electrode 214 may be formed as a transparent electrode. Because the first emission layer 215 is formed of a material that has high transmittance when a power is not applied thereto, the external light transmittance of the first transmission region 212 may be high.

Figure 6:
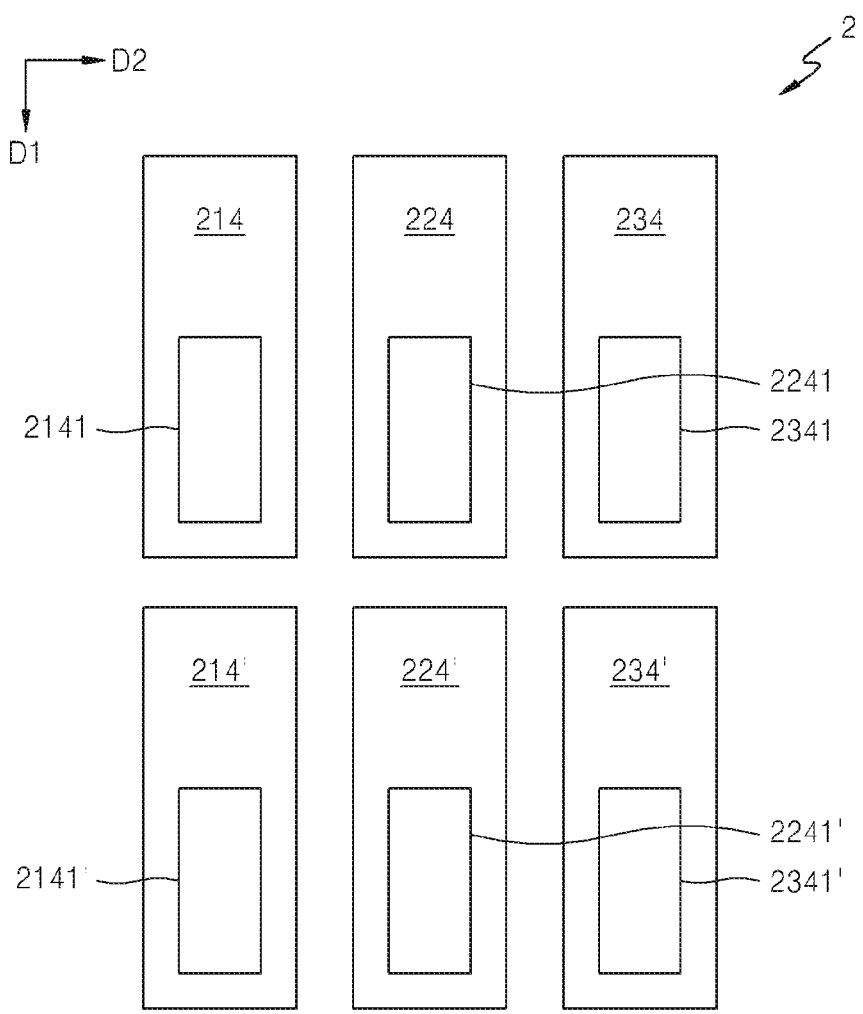
FIG. 6 is a plan view showing a part of an organic emission unit according to another embodiment of the present invention.

FIG. 6 is a partial plan view of an organic emission unit according to another embodiment of the present invention. FIG. 6 shows another embodiment of the 1-1 electrodes 214 and 214', the 2-1 electrodes 224 and 224', and the 3-1 electrodes 234 and 234'. The 1-1 openings 2141 and 2141', 2-1 openings 2241 and 2241', and 3-1 openings 2341 and 2341' may be formed on regions substantially corresponding to the first transmission regions 212 and 212', the second transmission regions 222 and 222', and the third transmission regions 232 and 232' of the 1-1 electrodes 214 and 214', the 2-1 electrodes 224 and 224', and the 3-1 electrodes 234 and 234', respectively, as shown in FIG. 3. Accordingly, even when the 1-1 electrodes 214 and 214', the 2-1 electrodes 224 and 224', and the third electrodes 234 and 234' are formed as reflective electrodes, the external light transmittance of the first transmission regions 212 and 212', the second transmission regions 222 and 222', and the third transmission regions 232 and 232' may not be reduced.

Figure 7:
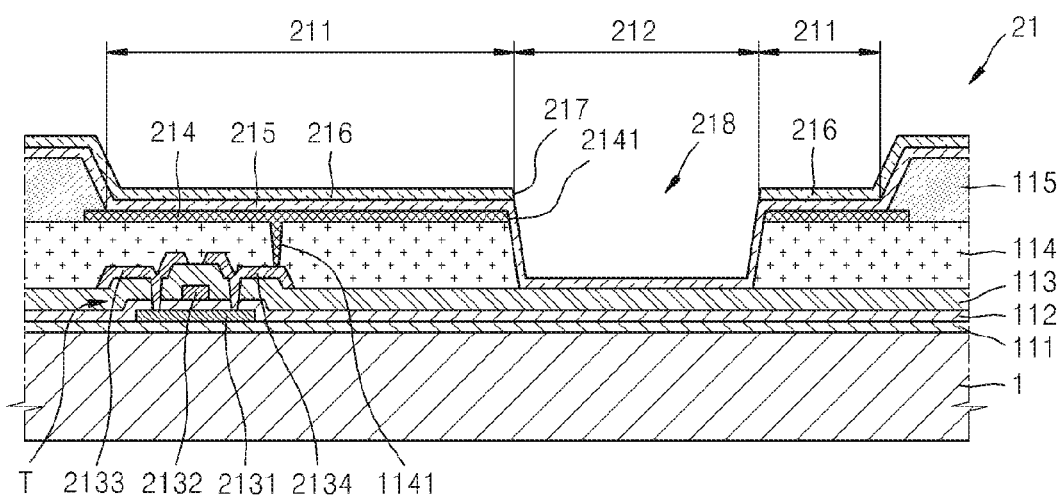
FIG. 7 is a partially cross-sectional view of a first sub-pixel according to an embodiment of the present invention.

FIG. 7 is a cross-sectional view of the first sub-pixel 21 according to another embodiment of the present invention. In FIG. 7, the 1-1 opening 2141 is formed in the 1-1 electrode 214, and a second opening 1141 is formed in the passivation layer 114. The 1-1 opening 2141 and the second opening 1141 are formed in the region corresponding to the first transmission region 212. According to the embodiment shown in FIG. 7, the second opening 1141 is formed in or though the passivation layer 114, and thus, the external light transmittance of the first transmission region 212 may be further increased. Although FIG. 7 only shows the first sub-pixel 21, the embodiment shown in FIG. 7 may be similarly applied to each of the second and third sub-pixels.

Referring to FIG. 7, the first emission layer 215 is in the first transmission region 212 (e.g., an opening is not formed in the first emission layer 215 at a portion corresponding to the first transmission region 212); however, the present invention is not limited thereto. That is, the first emission layer 215 may have an opening at the portion corresponding to the first transmission region 212.

Also, according to the embodiment shown in FIG. 7, the second opening 1141 is formed only in or through the passivation layer 114; however, the present invention is not limited thereto. That is, the second opening may be formed in the inter-insulating layer (interlayer dielectric) 113, the gate insulating layer 112, and/or the buffer layer 111 at a portion corresponding to the first transmission region 212.

Figure 8:
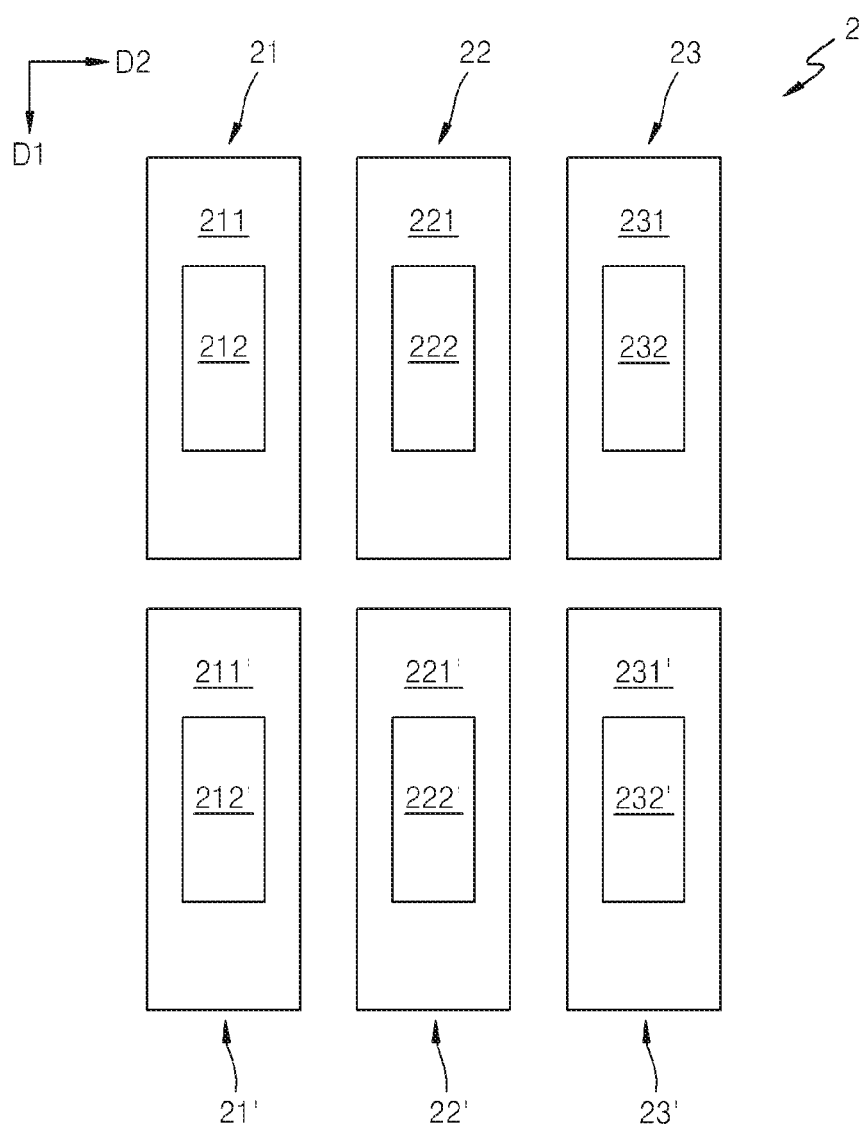
FIG. 8 is a plan view of a part of an organic emission unit according to another embodiment of the present invention.

FIG. 8 is a partial plan view of another embodiment of the organic emission unit 2 in more detail.

Referring to FIG. 8, the first transmission regions 212 and 212' are located at center portions of the first sub-pixels 21 and 21' along the first direction D1, unlike the embodiment shown in FIG. 3. In addition, the second transmission regions 222 and 222' are located at center portions of the second sub-pixels 22 and 22', respectively, along the first direction D1, and the third transmission regions 232 and 232' are located at center portions of the third sub-pixels 23 and 23', respectively, along the first direction D1. Accordingly, the first sub-pixels 21 and 21' may not appear as if they are disconnected from each other along the first direction D1. The appearance of the second and third sub-pixels 22, 22', 23, and 23' being disconnected from each other along the first direction D1 may also be reduced or prevented.

FIG. 8 is a schematic plan view of the first sub-pixels 21 and 21', the second sub-pixels 22 and 22', and the third sub-pixels 23 and 23'; however, detailed structures shown in FIGS. 4 through 7 may be applied thereto.

Figure 9:
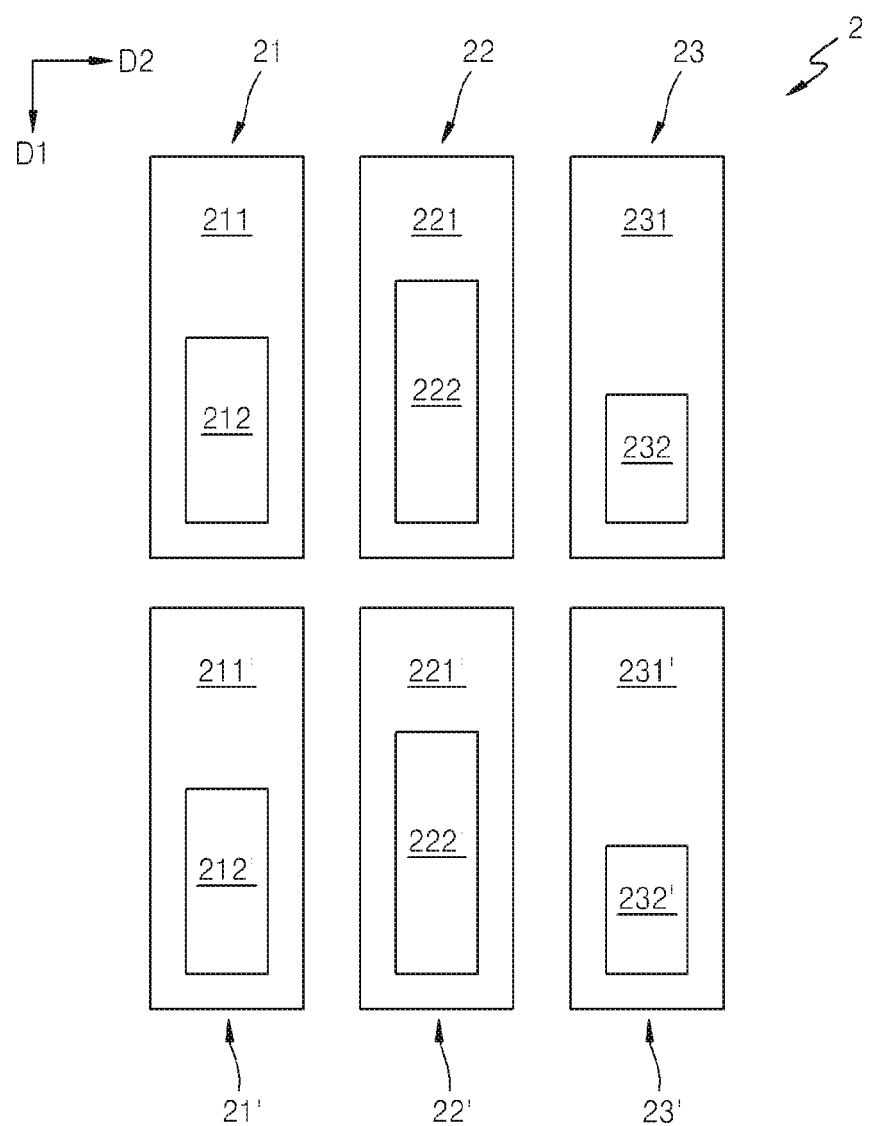
FIG. 9 is a plan view of a part of an organic emission unit according to another embodiment of the present invention.

FIG. 9 is a partial plan view of the organic emission unit 2 according to another embodiment in more detail.

Referring to FIG. 9, the first transmission regions 212 and 212', the second transmission regions 222 and 222', and the third transmission regions 232 and 232' have different sizes from each other, unlike the embodiment shown in FIG. 3. The sizes of the first transmission regions 212 and 212', the second transmission regions 222 and 222', and the third transmission regions 232 and 232' may be determined according to differences between light emitting efficiencies of the first emission regions 211 and 211', the second emission regions 221 and 221', and the third emission regions 231 and 231', respectively. That is, the size of the transmission region of the sub-pixel having the emission region which has a greater emission efficiency is increased (e.g., is larger compared with the transmission regions of the other sub-pixels), and the size of the transmission region of the sub-pixel having the emission region which has a lower emission efficiency is reduced. The light emission efficiencies of the emission regions may be determined by (e.g., according to) emission efficiencies of the light emission layers of the sub-pixels.

Accordingly, the size of the transmission region is reduced in the sub-pixel having a lower light emission efficiency, thereby preventing further reduction of the light emission efficiency. Also, light emission efficiencies of pixels, each including sub-pixels emitting light of different colors, may be maintained (e.g., constantly maintained).

FIG. 9 is a schematic plan view showing the first sub-pixels 21 and 21', the second sub-pixels 22 and 22', and the third sub-pixels 23 and 23'; however, detailed structures shown in FIGS. 4 through 7 may be applied to the structure of FIG. 9.

Figure 10:
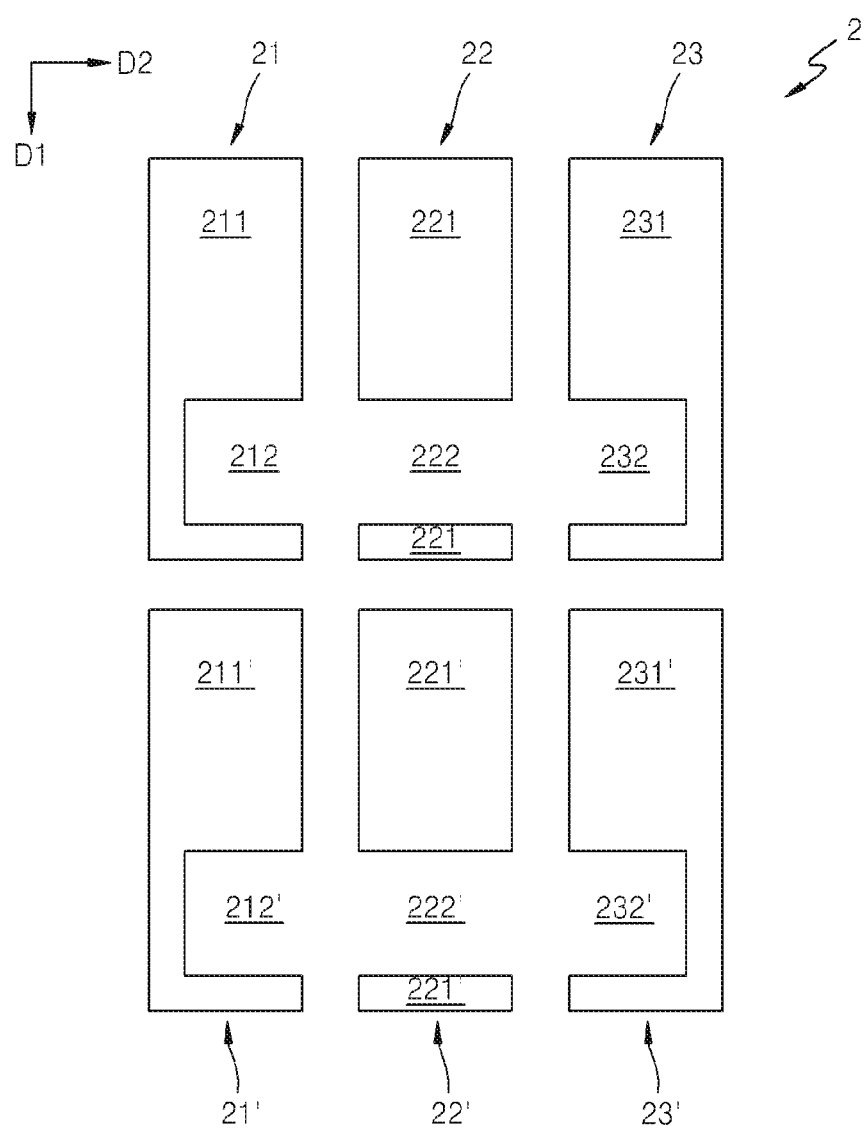
FIG. 10 is a plan view of a part of an organic emission unit according to another embodiment of the present invention.

FIG. 10 is a partial plan view of the organic emission unit 2 according to another embodiment of the present invention.

Referring to FIG. 10, the first transmission regions 212 and 212', the second transmission regions 222 and 222', and the third transmission regions 232 and 232' are formed to have different shapes from each other, unlike the embodiment shown in FIG. 3. The second transmission regions 222 and 222' are formed as squares at a center portion along the second direction D2 of the second sub-pixels 22 and 22', respectively, the first transmission regions 212 and 212' are formed on side portions (e.g., on a portion of an edge extending along the first direction D1 and nearest the second transmission regions 222 and 222') of the first sub-pixels 21 and 21', and the third transmission regions 232 and 232' are formed on other side portions (e.g., a portion of an edge extending along the first direction D1 and nearest the second transmission regions 222 and 222') of the third sub-pixels 23 and 23'. The first transmission regions 212 and 212' and the third transmission regions 232 and 232' are formed to be symmetric with each other about the second transmission regions 222 and 222', respectively. The second emission regions 221 and 221' are each separated into a plurality of portions along the first direction D1 by the second transmission regions 222 and 222'.

Ones of the first, second, and third transmission regions 212, 222 and, 232 may be combined to form a large, rectangular transmission region and other ones of the first, second, and third transmission regions 212', 222' and, 232' may be combined to form another large, rectangular transmission region.

Here, the first emission region 211 is adjacent to the other first emission region 211' along the first direction D1, the second emission region 221 is adjacent to the other second emission region 221' along the first direction D1, and the third emission region 231 is adjacent to the other third emission region 231' along the first direction D1. Thus, the disconnected appearance of the colors may be reduced or prevented.

Figure 11:
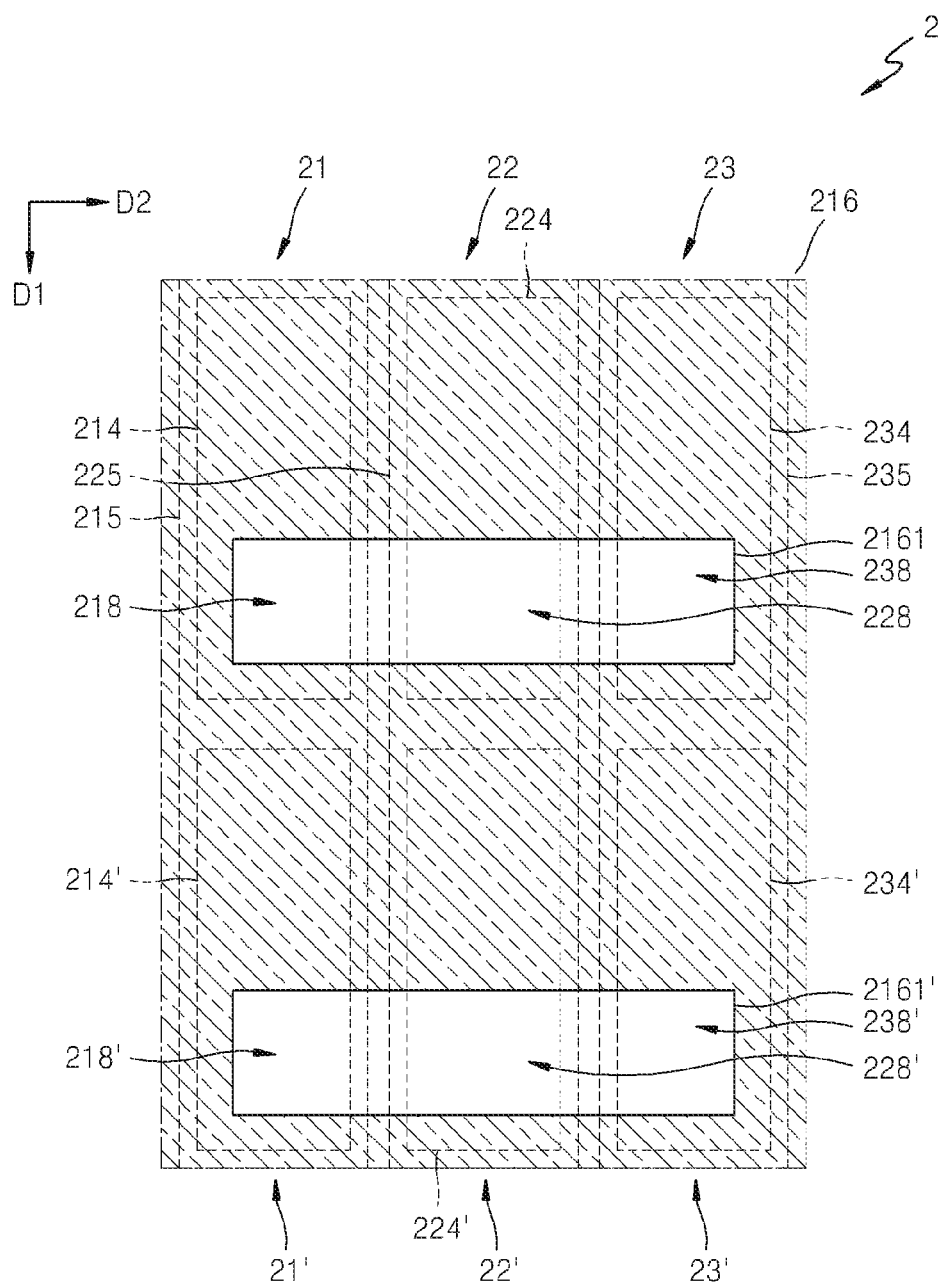
FIG. 11 is a partial plan view of the organic emission unit of FIG. 10.

FIG. 11 is a partial plan view of the embodiment shown in FIG. 10 in more detail.

According to the embodiment shown in FIG. 11, the 1-1 electrodes 214 and 214', the 2-1 electrodes 224 and 224', and the 3-1 electrodes 234 and 234' may be formed as rectangles, longer sides of which extend along the first direction D1, similar to the embodiment shown in FIG. 4. In addition, the first emission layer 215, the second emission layer 225, and the third emission layer 235 may be similar to those shown in FIG. 4. However, unlike the embodiment shown in FIG. 4, fourth transmission windows 2161 and 2161' are formed in the second electrode 216. The fourth transmission windows 2161 and 2161' of FIG. 11 are formed as the first transmission windows 217 and 217', the second transmission windows 227 and 227', and the third transmission windows 237 and 237' of FIG. 4 connected to each other along the second direction D2. By forming the fourth transmission windows 2161 and 2161' in the second electrode 216, the first transmission units 218 and 218' may be formed on regions of the 1-1 electrodes 214 and 214', the second transmission units 228 and 228' may be formed on regions of the 2-1 electrodes 224 and 224', and the third transmission units 238 and 238' may be formed on regions of the 3-1 electrodes 234 and 234'. In the present embodiment, a region is any region or portion except for end portions in the first direction D1 of any of the 1-1 electrodes 214 and 214', the 2-1 electrodes 224 and 224', and the 3-1 electrodes 234 and 234', and is not limited to a location in the exact or direct center of the 1-1 electrodes 214 and 214', the 2-1 electrodes 224 and 224', and the 3-1 electrodes 234 and 234' in either the first or second direction D1 or D2.

Figure 12:
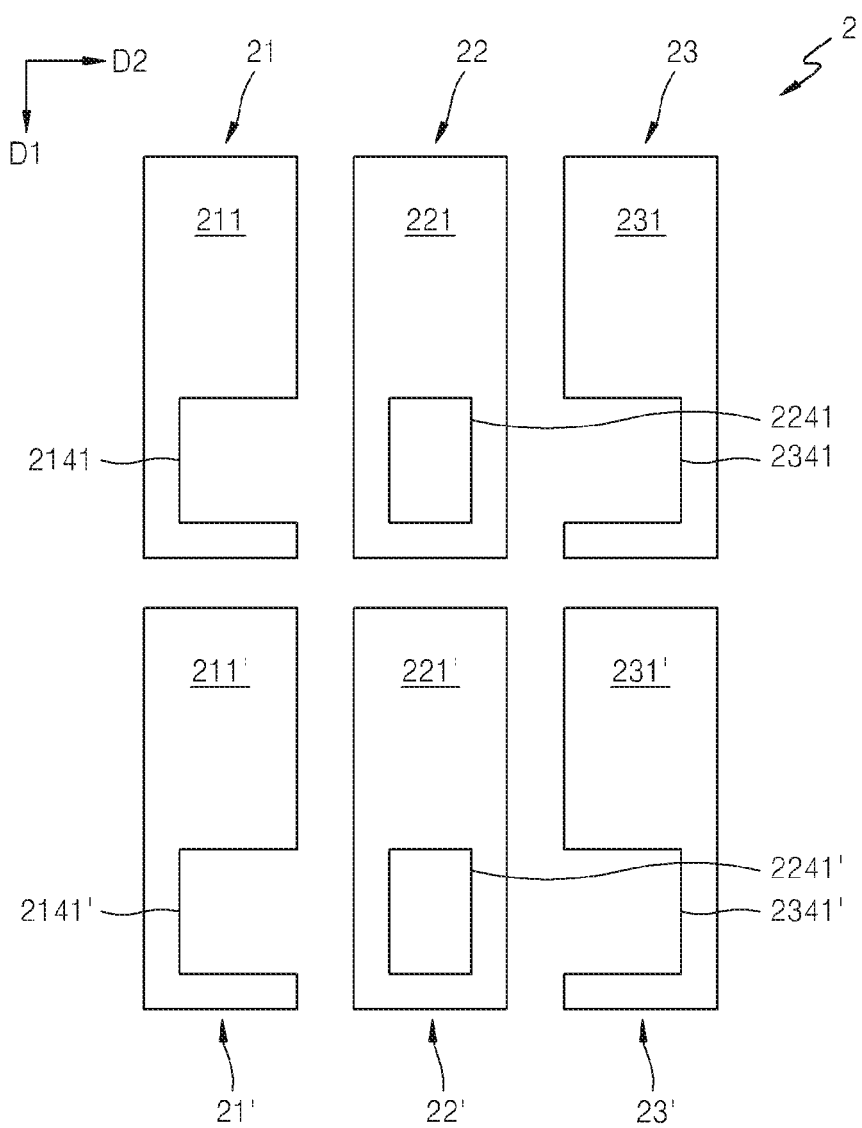
FIG. 12 is a plan view of a part of an organic emission unit according to another embodiment of the present invention.

The embodiment shown in FIG. 12 may be formed by using the 1-1 electrodes 214 and 214', the 2-1 electrodes 224 and 224', and the 3-1 electrodes 234 and 234' similar to those shown in FIG. 11. That is, 1-1 openings 2141 and 2141' formed in the 1-1 electrodes 214 and 214' may open toward the 2-1 electrodes 224 and 224' (e.g., extend across edges of the first emission regions 211 and 211' extending along the second direction D2 and nearest the second emission regions 221 and 221'), 3-1 openings 2341 and 2341' formed in the 3-1 electrodes 234 and 234' may open toward the 2-1 electrodes 224 and 224' (e.g., extend across edges of the third emission regions 231 and 231' extending along the second direction D2 and nearest the second emission regions 221 and 221'), and 2-1 openings 2241 and 2241' may be formed in a portion except for a portion including an edge of the 2-1 electrodes 224 and 224' (e.g., may be formed in center portions of the 2-1 electrodes 224 and 224'). In this case, even when the 1-1 electrodes 214 and 214', the 2-1 electrodes 224 and 224', and the third electrodes 234 and 234' are formed as reflective electrodes, the external light transmittance in the transmission regions may not be largely degraded.

In addition, as shown in FIG. 7, openings corresponding to the above described openings may be formed in the passivation layer 114, or be openings formed in the inter-insulating layer 113, the gate insulating layer 112, and/or the buffer layer 111 at the portion corresponding to the first transmission region 212.

Figure 13:
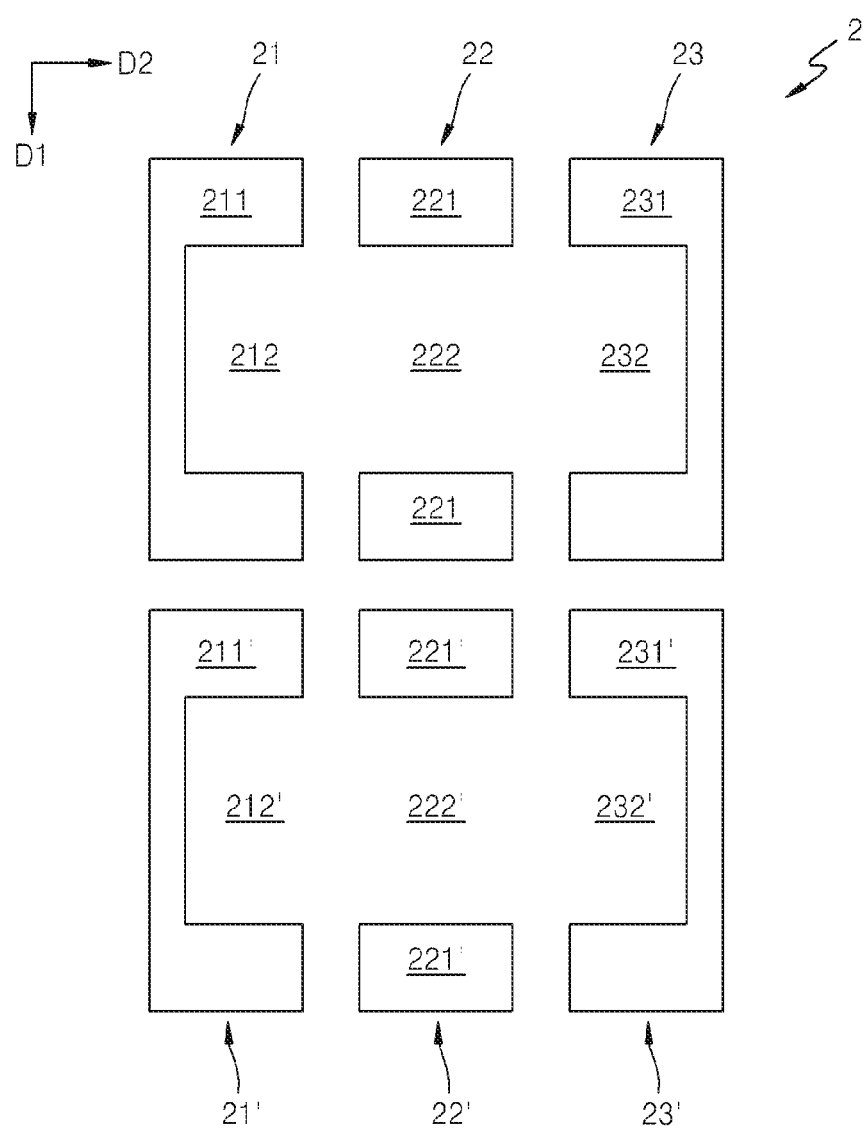
FIG. 13 is a plan view of a part of an organic emission unit according to another embodiment of the present invention.

FIG. 13 is a partial plan view of the organic emission unit 2 according to another embodiment of the present invention in more detail.

Referring to FIG. 13, the first transmission regions 212 and 212' are formed in center portions along the first direction D1 of the first sub-pixels 21 and 21', the second transmission regions 222 and 222' are located in center portions along the first direction D1 of the second sub-pixels 22 and 22', and the third transmission regions 232 and 232' are located in center portions along the first direction D1 of the third sub-pixels 23 and 23', unlike the embodiment shown in FIG. 10. Accordingly, the disconnected appearance of a display due to the separation of the first sub-pixels 21 and 21' along the first direction D1 may be reduced. Likewise, the second sub-pixels 22 and 22' and the third sub-pixels 23 and 23' may not appear to be disconnected.

Figure 14:
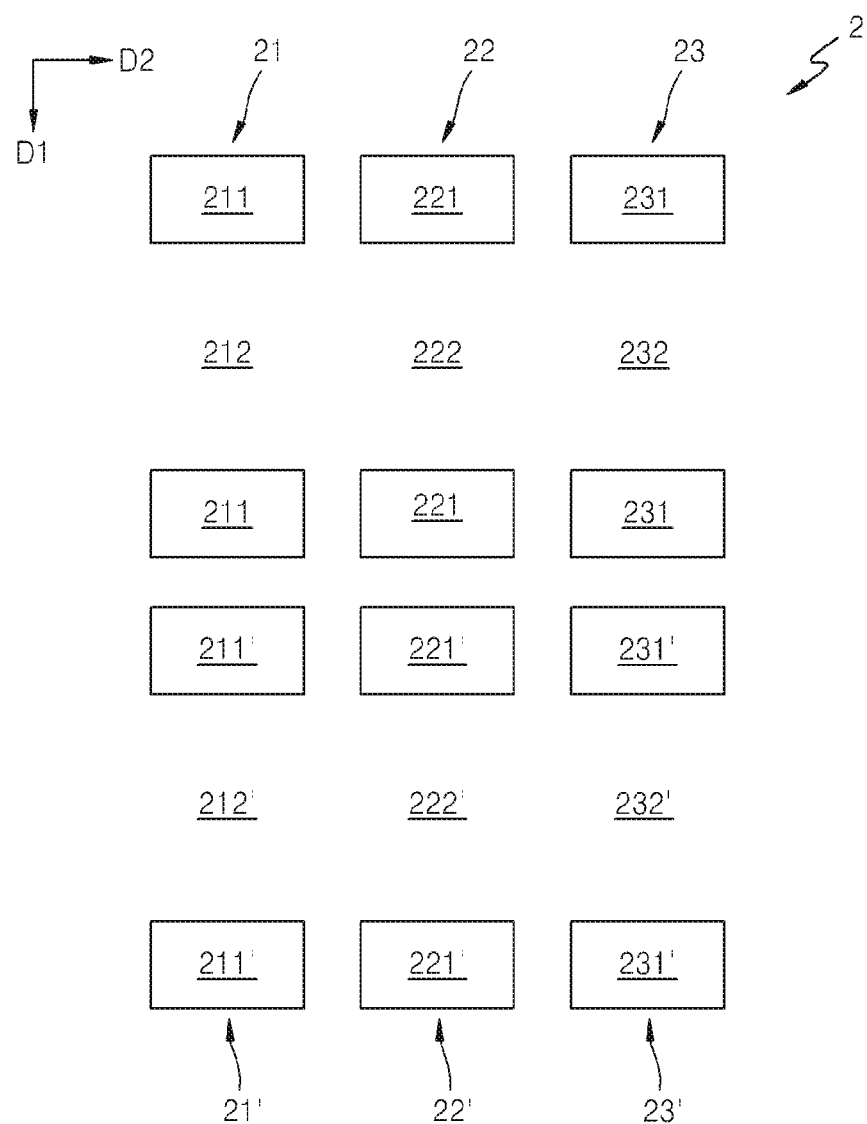
FIG. 14 is a plan view of a part of an organic emission unit according to another embodiment of the present invention.

FIG. 14 is a partial plan view of the organic emission unit 2 according to another embodiment of the present invention in greater detail.

Referring to FIG. 14, each of the first emission regions 211 and 211' are separated into a plurality of portions (e.g., two portions) along the first direction D1 by (e.g., based on) the first transmission regions 212 and 212', respectively, each of the second emission regions 221 and 221' are separated into a plurality of portions (e.g., two portions) along the first direction D1 by the second transmission regions 222 and 222', respectively, and each of the third emission regions 231 and 231' are separated into a plurality of portions (e.g., two portions) along the first direction D1 by the third transmission regions 232 and 232', respectively. Accordingly, the external light transmittance of the organic emission unit 2 may be improved, and the disconnected appearance of colors along the first direction D1 may be reduced.

Although not shown in FIG. 14, 1-1 electrodes, 2-1 electrodes, and 3-1 electrodes may be formed as rectangles, longer sides of which extend along the first direction D1, as shown in FIGS. 4 and 11, and the second electrode 216 may be patterned or formed to correspond to the first transmission regions 212 and 212', the second transmission regions 222 and 222', and the third transmission regions 232 and 232'. However, the present invention is not limited thereto, and the 1-1 electrodes, the 2-1 electrodes, and the 3-1 electrodes may be formed similar to the 2-1 electrodes 224 and 224' and the 2-1 openings 2241 and 2241' shown in FIGS. 11 and 12. Moreover, the second opening 1141 may be formed in the passivation layer 114 as shown in FIG. 7.

Figure 15:
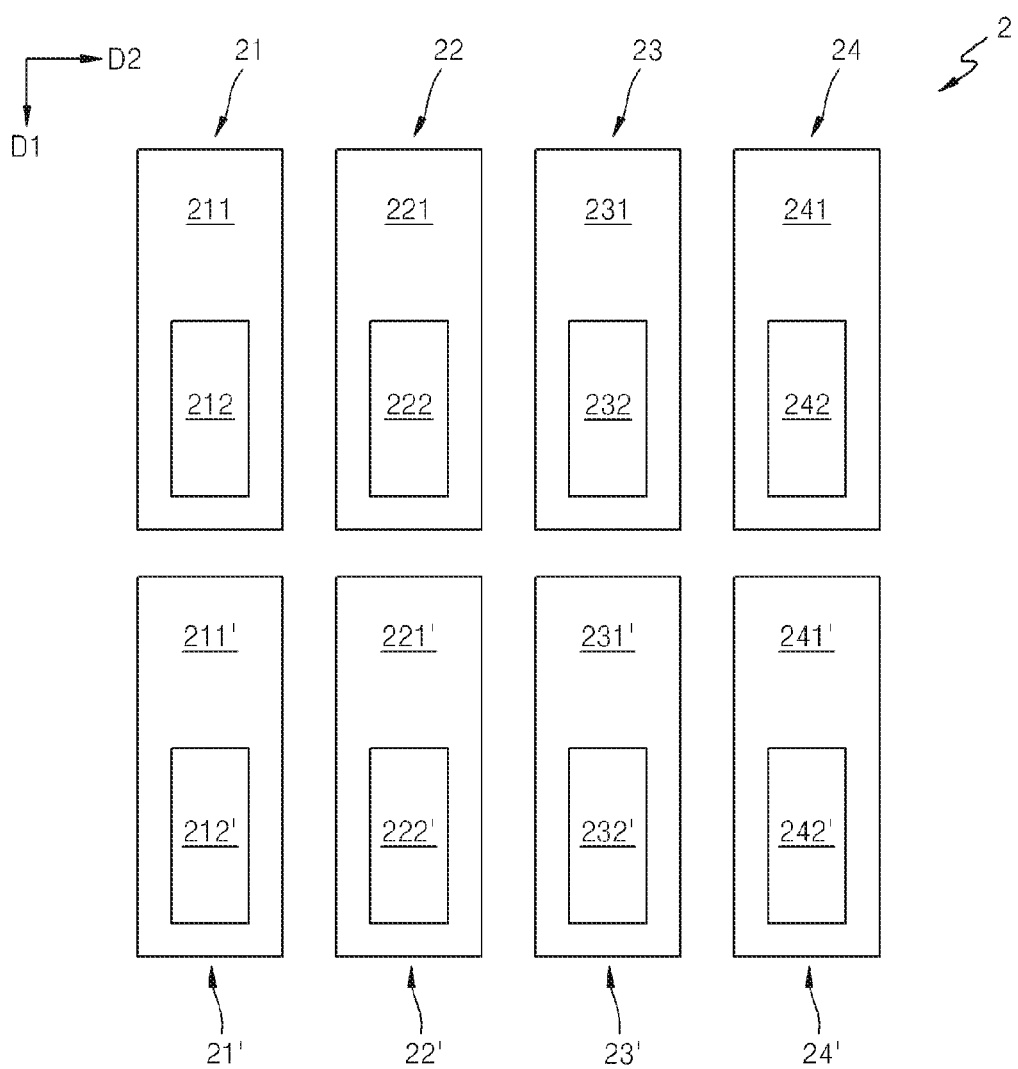
FIG. 15 is a plan view of a part of an organic emission unit according to another embodiment of the present invention.

FIG. 15 is a partial plan view of the organic emission unit 2 according to another embodiment of the present invention in more detail.

Referring to FIG. 15, fourth sub-pixels 24 and 24' emit light of a fourth color that is different from the first through third colors and are disposed (e.g., located) adjacent to the third sub-pixels 23 and 23', respectively, along the second direction D2, in addition to having a structure similar to that shown in FIG. 3. The fourth sub-pixels 24 and 24' are arranged along the first direction D1 to form one column line. The fourth color light may be white.

The fourth sub-pixels 24 and 24' respectively include fourth emission regions 241 and 241' and fourth transmission regions 242 and 242'. The fourth emission regions 241 and 241' emit light of the fourth color, and external light transmits (e.g., without emitting light) through the fourth transmission regions 242 and 242'.

The fourth emission region 241 of the one fourth sub-pixel 24 and the fourth emission region 241' of the other fourth sub-pixel 24' are adjacent to each other in the first direction D1.

Other components are similar to those shown in FIG. 3, and descriptions thereof are omitted here.

As described above, the embodiment shown in FIG. 15 illustrates a structure in which one pixel includes four sub-pixels emitting different color light, for example, red, green, blue, and white, and the structure in which the one pixel includes four sub-pixels may be applied to the embodiments shown in FIGS. 8 through 10, 13, and 14.

While the present invention has been particularly shown and described with reference to embodiments thereof, it will be understood by those of ordinary skill in the art that various changes in form and details may be made therein without departing from the spirit and scope of the present invention as defined by the following claims and their equivalents.

What is claimed is:

1. An organic light emitting display device comprising:
a plurality of first sub-pixels arranged adjacent to each other along a first direction, each of the plurality of first sub-pixels comprises a 1-1 electrode, a first emission region configured to emit light of a first color, and a first transmission region configured to transmit external light, wherein the first emission regions of at least two of the plurality of first sub-pixels are adjacent to each other, and the 1-1 electrode of one of the first sub-pixels is separated from the 1-1 electrode of an adjacent one of the first sub-pixels; and
a plurality of second sub-pixels arranged adjacent to each other along the first direction and adjacent to corresponding ones of the plurality of first sub-pixels along a second direction crossing the first direction, each of the plurality of second sub-pixels comprises a second emission region configured to emit light of a second color different from the first color and a second transmission region configured to transmit external light, wherein the second emission regions of at least two of the plurality of second sub-pixels are adjacent to each other.

2. The organic light emitting display device of claim 1, wherein the first transmission region of one of the plurality of first sub-pixels and the second transmission region of a corresponding one of the plurality of second sub-pixels are adjacent to and separated from each other along the second direction.

3. The organic light emitting display device of claim 1, wherein the first transmission region is an island surrounded along its periphery by the first emission region.

4. The organic light emitting display device of claim 1, wherein the first transmission region of one of the plurality of first sub-pixels and the second transmission region of a corresponding one of the plurality of second sub-pixels are adjacent and connected to each other along the second direction.

5. The organic light emitting display device of claim 4, wherein the first emission region of one first sub-pixel is divided by the corresponding first transmission region.

6. The organic light emitting display device of claim 4, wherein the second emission region of one second sub-pixel is divided by the corresponding second transmission region.

7. The organic light emitting display device of claim 1, wherein the first transmission region and the second transmission region have areas that are different from each other.

8. The organic light emitting display device of claim 7, wherein either the first or second sub-pixel having a light emission efficiency greater than that of the other sub-pixel has a transmission region that is larger than the transmission region of the other sub-pixel.

9. The organic light emitting display device of claim 1, wherein the first emission region and the second emission region have shapes that are different from each other.

10. The organic light emitting display device of claim 1, wherein the first transmission region and the second transmission region have shapes that are different from each other.

11. The organic light emitting display device of claim 1, further comprising:
a first emission layer on the 1-1 electrode, the first emission layer configured to emit light of the first color;
a 2-1 electrode in each of the plurality of second sub-pixels;
a second emission layer on the 2-1 electrode, the second emission layer configured to emit light of the second color; and
a second electrode on the first and second emission layers, the second electrode comprises a first transmission unit at a portion corresponding to the 1-1 electrode and configured to transmit external light, and a second transmission unit at a portion corresponding to the 2-1 electrode and configured to transmit external light.

12. The organic light emitting display device of claim 11, wherein the first transmission unit is not formed on a location corresponding to at least an edge portion of the 1-1 electrode.

13. The organic light emitting display device of claim 11, wherein the second transmission unit is not formed on a location corresponding to at least an edge portion of the 2-1 electrode.

14. The organic light emitting display device of claim 1, wherein the second transmission region is an island surrounded along its periphery by the second emission region.

15. The organic light emitting display device of claim 1, further comprising:
   a first emission layer on the 1-1 electrode, the first emission layer configured to emit light of the first color; and
   a second electrode on the first emission layer,
   wherein the 1-1 electrode in each of the plurality of first sub-pixels extends entirely through the respective first transmission region.

16. The organic light emitting display device of claim 1, further comprising:
   a first emission layer on the 1-1 electrode, the first emission layer configured to emit light of the first color and extending entirely through the respective first transmission region; and
   a second electrode on the first emission layer.

* * * * *